United States Patent
Okada et al.

(10) Patent No.: US 10,109,766 B2
(45) Date of Patent: Oct. 23, 2018

(54) LIGHT EMITTING DEVICE AND METHOD FOR MANUFACTURING SAME

(71) Applicant: NICHIA CORPORATION, Anan-shi, Tokushima (JP)

(72) Inventors: Yuji Okada, Tokushima (JP); Masafumi Kuramoto, Tokushima (JP)

(73) Assignee: NICHIA CORPORATION, Anan-Shi (JP)

( * ) Notice: Subject to any disclaimer, the term of this patent is extended or adjusted under 35 U.S.C. 154(b) by 0 days.

(21) Appl. No.: 14/620,309

(22) Filed: Feb. 12, 2015

(65) Prior Publication Data

US 2015/0228875 A1 Aug. 13, 2015

(30) Foreign Application Priority Data

Feb. 13, 2014 (JP) ................................. 2014-025813

(51) Int. Cl.
*H01L 27/15* (2006.01)
*H01L 33/00* (2010.01)
(Continued)

(52) U.S. Cl.
CPC ........ *H01L 33/0095* (2013.01); *H01L 33/505* (2013.01); *H01L 33/54* (2013.01);
(Continued)

(58) Field of Classification Search
CPC ... H01L 27/32–27/326; H01L 51/50–51/5287;
(Continued)

(56) References Cited

U.S. PATENT DOCUMENTS

2002/0121645 A1 9/2002 Yasukawa et al.
2002/0134988 A1* 9/2002 Ishinaga ............... F21V 7/0091
257/99
(Continued)

FOREIGN PATENT DOCUMENTS

JP H06-132565 A 5/1994
JP 11-103097 A 4/1999
(Continued)

OTHER PUBLICATIONS

Office Action dated Jul. 4, 2017 in Japanese Patent Application No. 2014-025813.
(Continued)

*Primary Examiner* — Cuong B Nguyen
*Assistant Examiner* — Samuel Park
(74) *Attorney, Agent, or Firm* — Foley & Lardner LLP (57) ABSTRACT

A light-emitting device includes lead frames, a light-emitting element placed on a bottom of a recessed portion formed at one of the lead frames, and a light-transmitting resin covering the light-emitting element. The lead frames have a covered region which is covered with the light-transmitting resin and an exposed region exposed out of the light-transmitting resin. The light-emitting device has a gap between the lead frame and the light-transmitting resin at an inner side surface of the recessed portion, the gap having a width longer than a main wavelength of light from the light-emitting element. The lead frame is in close contact with the light-transmitting resin at an end of the covered region, which is located in a boundary with the exposed region or in the vicinity of the boundary within the covered region.

17 Claims, 5 Drawing Sheets

(51) Int. Cl.
   *H01L 33/50* (2010.01)
   *H01L 33/54* (2010.01)
(52) U.S. Cl.
   CPC .......... *H01L 2224/48091* (2013.01); *H01L 2224/48247* (2013.01); *H01L 2933/005* (2013.01)
(58) Field of Classification Search
   CPC .......... H01L 2227/32–2227/326; H01L 2251/5323–2251/5361; H01L 2924/12044; H01L 33/0095; H01L 33/54; H01L 33/505; H01L 2933/005; H01L 2224/48091; H01L 2224/48247
   See application file for complete search history.

(56) References Cited

U.S. PATENT DOCUMENTS

| | | | | |
|---|---|---|---|---|
| 2005/0211992 A1* | 9/2005 | Nomura | ............. | H01L 33/502 257/79 |
| 2005/0222369 A1* | 10/2005 | Sue | ............. | C07C 323/16 528/86 |
| 2009/0137775 A1* | 5/2009 | Ito | ............. | C08G 59/24 528/405 |
| 2009/0140284 A1* | 6/2009 | Kurino | ............. | C08G 83/001 257/100 |
| 2010/0053976 A1 | 3/2010 | Cornelissen et al. | | |
| 2011/0076553 A1* | 3/2011 | Kameda | ............. | H01M 2/043 429/181 |
| 2011/0159302 A1 | 6/2011 | Hirai et al. | | |
| 2013/0277684 A1* | 10/2013 | Araki | ............. | H01L 21/0243 257/76 |
| 2014/0020932 A1* | 1/2014 | Minami | ............. | H05K 3/389 174/251 |
| 2014/0042478 A1 | 2/2014 | Hirono et al. | | |
| 2014/0312371 A1* | 10/2014 | Wong | ............. | F21V 33/0004 257/98 |

FOREIGN PATENT DOCUMENTS

| | | |
|---|---|---|
| JP | 2002-261333 A | 9/2002 |
| JP | 2002-353518 A | 12/2002 |
| JP | 2004-087889 A | 3/2004 |
| JP | 2004-88002 A | 3/2004 |
| JP | 2010-517069 A | 5/2010 |
| JP | 2011-066302 A | 3/2011 |
| JP | 2012-195371 A | 10/2012 |
| JP | 2012-207228 A | 10/2012 |
| JP | 2013-138043 A | 7/2013 |
| WO | WO 2009/157445 A1 | 12/2009 |

OTHER PUBLICATIONS

Office Action dated Apr. 18, 2017 in corresponding Japanese Patent Application No. 2014-025813.
Decision of Rejection dated Sep. 26, 2017 in Japanese Patent Application No. 2014-025813.

* cited by examiner

LIGHT EMITTING DEVICE AND METHOD FOR MANUFACTURING SAME

CROSS-REFERENCE TO RELATED APPLICATION

The present application claims priority under 35 U. S. C. § 119 to Japanese Patent Application No. 2014-025813, filed Feb. 13, 2014. The contents of this application are incorporated herein by reference in their entirety.

TECHNICAL FIELD

The present disclosure relates to a light-emitting device and a method for manufacturing the light-emitting device.

BACKGROUND ART

Light-emitting devices including a light-emitting element placed on a lead frame and a light-transmitting resin covering the light-emitting device and part of the lead frame are widely used as a variety of light sources. Such a light-emitting device has a possibility of causing variations in light distribution due to deterioration over time (variations due to changes in light distribution) in addition to initial variations in light distribution resulting from a configuration of a light-transmitting resin or a lead frame, light distribution characteristics of a light-emitting element or a gloss level of lead frame plating.

Heat generation of the light-emitting element in mounting the light-emitting device on a substrate or using (lighting) the light-emitting device is thought to be a major cause for variations in light distribution due to deterioration over time, and specifically, there are the following two cases for this. One results from the deterioration of a light-emitting element due to thermal stress and the other one results from peeling between the lead frame and the light-transmitting resin due to heat or light.

In order to address variations in light distribution over time due to such a thermal stress, JP-A-2002-353518 proposes light-emitting device in which an internal stress is relaxed and stress exerted on the light-emitting element is reduced by lowering adhesiveness between the lead frame and the light-transmitting resin material to prevent the deterioration of the light-emitting element. This light-emitting device has the effect on variations in light distribution resulting from deterioration of the light-emitting element due to a thermal stress. However, this light-emitting device cannot prevent variations in light distribution from occurring, since peeling partially occurs due to heat or light in a region where the lead frame is in contact with the light-transmitting resin to cause a situation in which there is a mixture of a contact area and a peeled area of between the light-transmitting resin and the lead frame. Further, since a light-transmitting resin having low adhesiveness is used in order to suppress thermal stress, there is a possibility that water or flux enters inside from the gap between the lead frame and the light-transmitting resin to corrode the light-emitting element or the lead frame.

JP-A-H11-103097 and JP-A-2004-88002 disclose prevention of water or flux from entering inside from the gap between the lead frame and the light-transmitting resin. In JP-A-H11-103097 and JP-A-2004-88002 propose to add a member for enhancing the adhesiveness between the lead frame and the light-transmitting resin at an end of the light-transmitting resin where the lead frame is exposed. In this case, it is necessary to add a sealing member other than the light-transmitting resin material and therefore there is a possibility that man-hour of manufacturing and production cost may increase.

SUMMARY OF THE INVENTION

A light-emitting device according to the present embodiment includes: a lead frame having a recessed portion; a light-emitting element provided on a bottom of the recessed portion of the lead frame; and a light-transmitting resin covering the light-emitting element and a portion of the lead frame. The lead frame has a covered region which is covered with the light-transmitting resin and an exposed region which is not covered with the light-transmitting resin. A gap is provided between the lead frame and the light-transmitting resin at an inner side surface of the recessed portion, the gap having a width longer than a main wavelength of light from the light-emitting element.

A method for producing a light-emitting device according to the present embodiment includes: a step of preparing a lead frame having a recessed portion in which a light-emitting element is placed and provided with an adhesion-imparting agent at least on part of the lead frame other than the inner side surface of the recessed portion; and a step of bringing the lead frame provided with the adhesion-imparting agent into close contact with the light-transmitting resin by covering part of the lead frame and the light-emitting element with the light-transmitting resin containing a curing accelerator, and forming a gap between the lead frame and the light-transmitting resin at an inner side surface of the recessed portion, the gap having a width longer than a main wavelength of light from the light-emitting element.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings.

DESCRIPTION OF THE EMBODIMENTS

Description of Variations in Light Distribution due to Deterioration over Time

First, causes for variations in light distribution due to deterioration over time will be described.

At the end of manufacturing of the light-emitting device having a light-emitting element placed on a bottom of a recessed portion formed at the lead frame and including a light-transmitting resin covering the light-emitting device and the lead frame, the inner side surface of the recessed portion of the lead frame and the light-transmitting resin are in a state of being in contact with each other. On the other hand, after use for a predetermined period of time, peeling partially occurs between the inner side surface of the recessed portion and the light-transmitting resin in contact with each other due to heat generation or light in mounting the light-emitting device on a substrate or using (lighting) the light-emitting device. Therefore, a situation occurs, in which there is irregularly a mixture of a contact region and a peeled region of between the inner side surface of the recessed portion and the light-transmitting resin.

In a region in which the inner side surface of the recessed portion is in contact with the light-transmitting resin, light output from the light-emitting element is reflected on the inner side surface of the recessed portion. On the other hand, in a region in which the light-transmitting resin is peeled off from the inner side surface of the recessed portion, light is all reflected on the end surface of the light-transmitting resin when there is a gap having a width longer than a main wavelength of the light. Thus, a reflecting surface is different between a region in which peeling occurs and a region in which peeling does not occur, and vary a direction of light extracted from the light-emitting element to the outside of the light-transmitting resin. Thus, variations in light distribution occur due to deterioration over time. Herein, the phrase "reflecting surface is different" refers to the case in which members serving as a reflecting surface are different. For example, the members refer to the end surface of the light-transmitting resin and the inner side surface of the recessed portion of the lead frame.

Further, after use for a predetermined period of time, also at the bottom as with the inner side surface of the recessed portion, variations in light distribution may occur since a situation occurs, in which there is irregularly a mixture of a contact region and a peeled region of between the bottom of the recessed portion and the light-transmitting resin. For example, when the light-transmitting resin is peeled off from the inner side surface of the recessed portion, stress is exerted and there is a possibility that partial peeling may occur between the light-transmitting resin and the bottom of the recessed portion.

In a region in which the bottom of the recessed portion is in contact with the light-transmitting resin, light output from the light-emitting element is all reflected on the bottom of the recessed portion. On the other hand, in a region in which the light-transmitting resin is peeled off from the bottom of the recessed portion (the light-transmitting resin is spaced apart from the bottom of the recessed portion), light is all reflected on the end surface of the light-transmitting resin when there is a gap having a width longer than a main wavelength of the light. As described below, in the present embodiment, such variations in light distribution due to deterioration over time can be prevented in advance.

(Description of Light-Emitting Device according to First Embodiment)

Figure 1A:
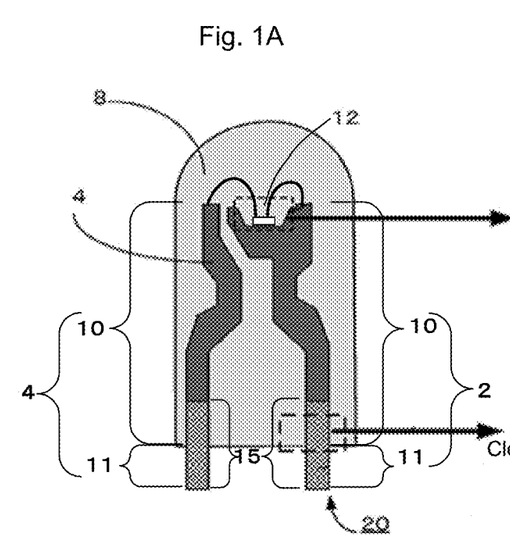
FIG. 1A is a schematic sectional view showing a light-emitting device according to a first embodiment.
Figure 1B:
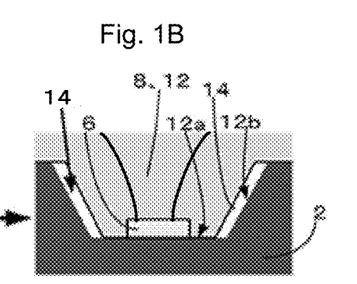
FIG. 1B is a schematic sectional view showing part of a recessed portion of a lead frame.
Figure 1C:
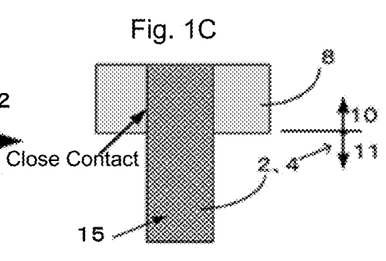
FIG. 1C is a schematic sectional view showing part of a lower portion of the lead frame.

FIG. 1A is a schematic sectional view showing a light-emitting device 20 according to a first embodiment. FIG. 1B is a schematic sectional view showing part of a recessed portion 12 of a lead frame. FIG. 1C is a schematic sectional view showing part of a lower portion of the lead frame. FIG. 1B and FIG. 1C are schematic sectional views of enlarged parts of a drawing of FIG. 1A.

A light-emitting device 20 is also referred to as a bullet type LED, and it includes a first lead frame 2 and a second lead frame 4, a light-emitting element 6 (e.g., an LED chip) placed on a bottom 12a of a recessed portion 12 formed at the first lead frame 2, and a light-transmitting resin 8 sealing the light-emitting element 6. The first lead frame 2 including the recessed portion 12 in which the light-emitting element 6 is placed, and the second lead frame 4 are covered with a bullet-shaped light-transmitting resin 8. For the purpose of illustration, regions of the first lead frame 2 and the second lead frame 4, which are covered with the light-transmitting resin 8, are referred to as a covered region 10, and regions of the first lead frame 2 and the second lead frame 4, which are exposed out of (i.e., not covered by) the light-transmitting resin 8, are referred to as an exposed region 11. In the present embodiment, in the exposed region 11, the first lead frame 2 and the second lead frame 4 are straight in a direction perpendicular to a bottom 12a of the recessed portion 12.

The bottom 12a of the recessed portion 12 of the first lead frame 2 is provided with an adhesive (not shown), and the light-emitting element 6 is fixed to the bottom 12a of the recessed portion 12 of the first lead frame 2. This is called die bonding. Further, the light-emitting element 6 is electrically connected to each of the first lead frame 2 and the second lead frame 4 with a respective wire. This is called wire bonding. The light-emitting element 6 has a pair of electrodes on the same surface side, and the pair of electrodes are electrically connected to the first lead frame 2 and the second lead frame 4. In addition, as the light-emitting element 6, a light-emitting element 6 having a pair of electrodes at a front surface and at a back surface which are different surfaces can also be employed. An electrode on the reverse side of the light-emitting element 6 can also be electrically connected to the first lead frame 2 by using a conductive adhesive.

Light from the light-emitting element 6 is all reflected at an end surface of the light-transmitting resin 8 and is reflected on the bottom 12a of the recessed portion 12. That is, part of the light from the light-emitting element 6 is reflected on the surface of the bottom 12a of the recessed portion 12 of the first lead frame 2. Therefore, the first lead frame 2 and the second lead frame 4 are preferably plated with metal having high optical reflectance, and specific examples of such plating include plating of gold, silver, rhodium, aluminum, platinum or alloys thereof, and silver having high reflectance for visible light is particularly preferred. Further, by plating the lead frames with silver, oxidation of underlying metal can be prevented, and reliable die bonding can be achieved to enable to efficiently reflect light from the light-emitting element 6 and the like particularly in the bottom 12a of the recessed portion 12 of the first lead frame 2.

In addition, as shown in FIG. 1B, in the present embodiment, since the inner side surface 12b of the recessed portion 12 of the first lead frame 2 is previously spaced apart from the light-transmitting resin 8, it is possible to prevent stress from being exerted when the light-transmitting resin 8 is peeled off from the inner side surface 12b and it is possible to suppress the occurrence of peeling between the bottom 12a of the recessed portion 12 and the light-transmitting resin 8. Thus, it is possible to prevent the situation in which there is irregularly a mixture of the contact region and the peeled region of between the bottom 12a of the recessed portion 12 and the light-transmitting resin 8 so that the occurrence of variations in light distribution can be previously prevented.

In addition, in FIG. 1A and FIG. 1C, a region 15 coated with an adhesion-imparting agent refers to a shaded region in a lower portion of each of the first lead frame 2 and the second lead frame 4, and represents a region provided with an adhesion-imparting agent.

The exposed region 11 includes a terminal portion functioning as a terminal of the light-emitting device 20. That is, lower portions of the first lead frame 2 and the second lead frame 4 are exposed out of the light-transmitting resin 8 and their ends function as a terminal part electrically connected to a circuit pattern on a substrate. In addition, in the present embodiment, the exposed region 11 of the first lead frame 2 and the second lead frame 4 extends in a direction orthogonal to a bottom 12a of the recessed portion 12. In other words, in the exposed region 11, the first lead frame 2 and the second lead frame 4 are straight in a direction perpendicular to the bottom 12a of the recessed portion 12. Since such a constitution is employed, the light-emitting device 20 of the present invention can be applied to a wide range of areas as a bullet type LED.

<Description of Gap between Inner Side Surface of Recessed Portion of Lead Frame and Light-Transmitting Resin>

As shown in FIG. 1B, in the present embodiment, at the end of manufacturing of the light-emitting device 20, the inner side surface 12b of the recessed portion 12 of the first lead frame 2 is previously spaced apart from the light-transmitting resin 8 and the light-emitting device 20 has a gap 14 having a predetermined width between the inner side surface 12b of the recessed portion 12 and the light-transmitting resin 8. In addition, a width of the gap 14 is longer than a main wavelength of light output from light-emitting element 6. Herein, the width of a gap 14 refers to a distance between an end surface of the light-transmitting resin 8 opposed to the inner side surface 12b of the recessed portion 12 and the inner side surface 12b of the recessed portion 12.

When the width of the gap 14 is longer than a main wavelength of light, the light output from the light-emitting element 6 is all reflected at an end surface of the light-transmitting resin 8. If the width of the gap 14 is shorter than a main wavelength of light, the light reaches the inner side surface 12b of the recessed portion 12 and is reflected on the inner side surface 12b of the silver-plated recessed portion 12, and part of the light is absorbed by silver plating. Accordingly, the case in which the light is all reflected at an end surface of the light-transmitting resin 8 is higher in light extraction efficiency than the case in which the light reaches the inner side surface 12b of the recessed portion 12 and is reflected. That is, while even metal having high reflectance such as silver absorbs part of light, in the present embodiment, most of light from the light-emitting element 6, which is directed to the inner side surface 12b, does not reach the inner side surface 12b of the recessed portion 12 and is all reflected at an end surface of the light-transmitting resin 8. Therefore, it is possible to prevent the light output from the light-emitting element 6 from being absorbed in the plated inner side surface 12b of the recessed portion 12.

In addition, even when the width of the gap 14 between the inner side surface 12b and the light-transmitting resin 8 is longer than a main wavelength of light, not all the light directed to the inner side surface 12b is positively reflected since total reflection depends on angles (incident angle, critical angle, etc.) of light from the light-emitting element 6 and a position of the located light-emitting element 6. However, when the width of the gap 14 is made to be longer than a main wavelength of light, a light quantity of the light from the light-emitting element 6 which is all reflected can be increased and light extraction efficiency can be enhanced compared with the case where the width of the gap 14 is below a main wavelength of the light.

If there is a mixture of a gap 14 having a width longer than a main wavelength of light output from the light-emitting element 6 and a gap 14 having a width below the main wavelength, since there is a mixture of regions having different reflecting surfaces, the variations in light distribution occur. When the width of the gap 14 between the inner side surface 12b of the recessed portion 12 and the light-transmitting resin 8 is previously set to be longer than a main wavelength of light output from the light-emitting element 6 as in the present embodiment, even if heat or light is applied, there is not a mixture of regions having different reflecting surfaces. Thus, the variations in light distribution do not occur due to deterioration over time.

In the present embodiment, the gap 14 between the inner side surface 12b of the recessed portion 12 of the first lead frame 2 and the light-transmitting resin 8 is preferably formed on an entire circumference of the inner side surface 12b of the recessed portion 12. With this configuration, a light quantity of the light output from the light-emitting element 6 and all reflected can be increased and light extraction efficiency can be enhanced. Moreover, it is possible to previously prevent stress from being exerted when the light-transmitting resin 8 is peeled off from the inner side surface 12b, and it is possible to suppress the occurrence of peeling between the bottom 12a of the recessed portion 12 and the light-transmitting resin 8.

Further, when a wavelength conversion member having an emission wavelength longer than a main wavelength of light from the light-emitting element 6 is disposed around the light-emitting element 6, specifically, when a wavelength conversion material which converts light output from the light-emitting element 6 to light having a longer wavelength is contained (e.g., dispersed) in the light-transmitting resin 8 covering the light-emitting element 6, it is preferred that in the inner side surface 12b of the recessed portion 12, the width of the gap 14 between the first lead frame 2 and the light-transmitting resin 8 is longer than a main wavelength of light from the wavelength conversion material.

With this configuration, the variations in light distribution due to deterioration over time can be suppressed with reliability in a light-emitting device 20 which emits light with an optional color.

For the wavelength conversion member having an emission wavelength longer than a main wavelength of light of the light-emitting element 6, the width of the gap 14 is longer than a wavelength (450 nm to 495 nm) of blue light, preferably a wavelength (570 nm to 590 nm) of yellow light, more preferably a main wavelength (590 nm) of yellow light, for example, in the case of a light-emitting device 20 outputting white light in which the light-emitting element 6 outputs blue light having a wavelength of 450 nm to 495 nm and a wavelength conversion material (fluorescent material) for converting blue light to yellow light having a wavelength of 570 nm to 590 nm is dispersed in the light-transmitting resin 8 surrounding the light-emitting element 6. In addition, the wavelength conversion material is not limited to this, and a wavelength conversion member capable of converting light having an optional wavelength to light having an optional wavelength may be employed.

In actual manufacturing of lighting devices, it is possible to form a gap 14 between the lead frame 2 and the light-transmitting resin 8 at an inner side surface 12b of the recessed portion 12, the gap 14 having a width equal to or longer than a main wavelength of light from the light-emitting element 6 or the wavelength conversion member by adding a proper curing accelerator as described below to the composition of the light-transmitting resin 8. Specifically, it is preferred to form a gap 14 having a width which is two times to five times longer than a main wavelength of light from the light-emitting element 6 or the wavelength conversion member when the light-emitting element 6 or the wavelength conversion member emits blue light, and a width which is two times to four times longer than a main wavelength of light from the light-emitting element 6 or the wavelength conversion member when emitting red light.

In the present embodiment, the light-emitting element 6 is fixed to the bottom 12*a* of the recessed portion 12 of the first lead frame 2 by using an adhesive, and since the applied adhesive spread on the bottom 12*a* while wetting the surface, the adhesive reaches an entire surface of the bottom 12*a* and the light-emitting element 6 and the light-transmitting resin 8 can be brought into close contact with the bottom 12*a*. That is, the first lead frame 2 is bonded to the light-transmitting resin 8 by the adhesive by which the light-emitting element 6 is fixed to the first lead frame 2. Therefore, heat generated from the light-emitting element 6 in lighting the light-emitting device 20 can be effectively extracted through the first lead frame 2.

(Description of Lead Frame in Close Contact with Light-Transmitting Resin)

As shown in FIG. 1C, in the present embodiment, the first lead frame 2 and the second lead frame 4 are in close contact with the light-transmitting resin 8 at ends of the covered regions 10. The term "end of the covered region 10" referred to herein refers to a region which is located in a boundary between the covered region 10 and the exposed region 11 or in the vicinity of the boundary within the covered region 10. The term "close contact" referred to herein refers to sufficient contact between the lead frames 2 and 4 to prevent water or flux from passing between the first lead frame 2 and the light-transmitting resin 8 or between the second lead frame 4 and the light-transmitting resin 8 in the areas where there is such close contact.

Thereby, it is possible to prevent water or flux from entering inside from the gap 14 between the first lead frame 2 and the light-transmitting resin 8 and the gap 14 between the second lead frame 4 and the light-transmitting resin 8, and prevent the light-emitting element 6 or the first lead frame 2 and the second lead frame 4 from being corroded.

In order to bring the first lead frame 2 and the second lead frame 4 into close contact with the light-transmitting resin 8, the first lead frame 2 and the second lead frame 4 are provided with adhesion-imparting agent at least at ends of the covered regions 10. With this configuration, the first lead frame 2 and the second lead frame 4 can be brought into close contact with the light-transmitting resin 8 with reliability even though the light-transmitting resin 8 contains the curing accelerator. Specific examples of providing the first lead frame 2 and the second lead frame 4 with the adhesion-imparting agent include embodiments as shown in FIG. 2 and FIG. 3.

Figure 2:
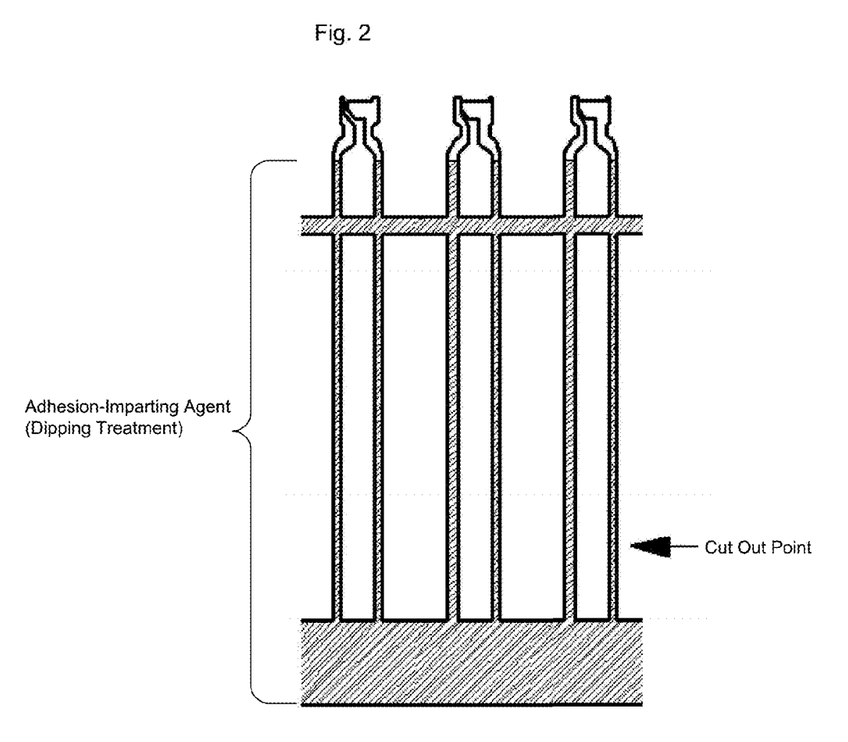
FIG. 2 is a view showing an embodiment of a base frame in which part of a region corresponding to a lead frame is provided with an adhesion-imparting agent.
Figure 3:
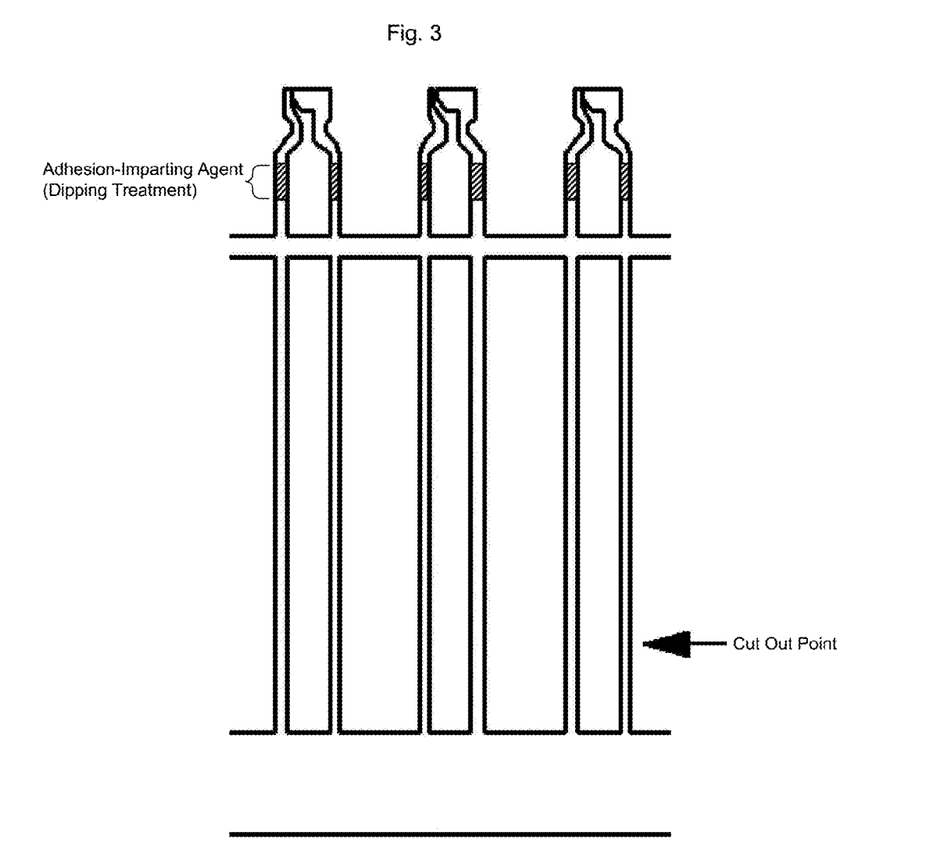
FIG. 3 is a view showing another embodiment of a base frame in which part of a region corresponding to a lead frame is provided with an adhesion-imparting agent.

FIG. 2 and FIG. 3 show a base frame in which part of a region corresponding to a lead frame is provided with an adhesion-imparting agent (shaded region). That is, FIG. 2 and FIG. 3 show a state in which the first lead frame 2 and the second lead frame 4 are not cut out from a base frame, and in FIG. 2, an adhesion-imparting agent is provided for an entire area from the end of the covered region 10 to the exposed region 11. In this case, the base frame provided with the adhesion-imparting agent can be formed, for example, by dipping the base frame into a liquid adhesion-imparting agent with a masked upper portion of the lead frame not provided with the adhesion-imparting agent.

In the embodiment of FIG. 2, the exposed region 11 includes a terminal portion functioning as a terminal, and at least the terminal portion is provided with the adhesion-imparting agent.

Here, in a common manufacturing process of a light-emitting device 20, silver plating becomes easy to permeate oxygen in the air by heating (e.g., heating at 150° C. or higher) in the step of bonding (die bonding) the light-emitting element 6 to the bottom 12*a* of the recessed portion 12 of the silver-plated lead frame. Accordingly, there is a possibility that underlying metal may be oxidized.

In this case, in the subsequent solder plating step, there is a possibility that proper solder plating is not carried out due to oxidation of an underlying metal when the end of a lead frame cut out from the base frame (e.g., a cross-section cut out from a base frame) is subjected to solder plating.

In the first lead frame 2 and the second lead frame 4 cut out in the embodiment of FIG. 2, since the adhesion-imparting agent is also provided for a lower end functioning as a terminal portion of the exposed region 11, silver plating is covered with the adhesion-imparting agent. Therefore, since the adhesion-imparting agent in an outermost layer prevents oxygen in the air from permeating even in heating during die bonding, oxidation of the underlying metal can be previously prevented. Accordingly, when the adhesion-imparting agent is provided at least for the terminal portion functioning as a terminal of the exposed region 11, proper solder plating can be performed in a subsequent solder plating step. Further, proper soldering can also be performed in the soldering step at the time of mounting the light-emitting device 20 on a circuit board.

In FIG. 3, the adhesion-imparting agent is provided only at the ends of the covered regions 10. In this case, the adhesion-imparting agent can be selectively provided by applying a water-soluble adhesion-imparting agent onto a specific region of the lead frame, the adhesion-imparting agent being less spread while wetting the surface.

In the first lead frame 2 and the second lead frame 4 cut out in the embodiment of FIG. 3, the adhesion-imparting agent is provided for an end of the covered region 10, but is not provided for a lower end functioning as a terminal portion. Therefore, in the present embodiment, it is possible to prevent water or flux from entering inside from the gap 14 between the lead frame and the light-transmitting resin 8 while reducing the cost of the light-emitting device 20 since the adhesion-imparting agent in the embodiment of FIG. 3 is less than that in the embodiment of FIG. 2.

In addition, for example, the adhesion-imparting agent can also be provided for the first lead frame 2 excluding the recessed portion 12 of the first lead frame 2 and the second lead frame 4. That is, this can be realized by providing the adhesion-imparting agent for the first lead frame 2 excluding the recessed portion 12 and the second lead frame 4 in the step of preparing the first lead frame 2 and the second lead frame 4.

The base frame provided with the adhesion-imparting agent can be formed by dipping the base frame into an adhesion-imparting agent with the recessed portion 12 masked, or can be formed by applying a water-soluble adhesion-imparting agent.

In this case, it is possible to form, with reliability, a gap 14 having a predetermined width between the inner side surface 12*b* of the recessed portion 12 of the first lead frame 2 and the light-transmitting resin 8, and in other regions of the first lead frame 2 excluding the recessed portion 12, it is possible to bring the first lead frame 2 and the second lead frame 4 into close contact with the light-transmitting resin 8 with reliability. That is, the first lead frame 2 excluding the recessed portion 12 and the second lead frame 4 are in a state of being in close contact with the light-transmitting resin 8 in the covered region 10 of the first lead frame 2 and the second lead frame 4.

In addition, the term "the first lead frame 2 excluding the recessed portion 12 and the second lead frame 4" includes the case of all surfaces of the first lead frame 2 excluding the recessed portion 12 and the second lead frame 4, and also includes the case of part of surfaces of the first lead frame 2 excluding the recessed portion 12 and the second lead frame 4.

As described above, any adhesion-imparting agent can be used for the adhesion-imparting agent according to the present embodiment, and among others, a water-soluble adhesion-imparting agent is preferred. With this configuration, the adhesion-imparting agent can be selectively provided with ease for the first lead frame 2 excluding the recessed portion 12 and the second lead frame 4.

As described above, the light-emitting device 20 of the present embodiment includes the first lead frame 2 and the second lead frame 4; the light-emitting element 6 placed on a bottom 12a of a recessed portion 12 formed at the first lead frame 2; and the light-transmitting resin 8 covering the light-emitting element 6, a part of region of the first lead frame 2 including the recessed portion 12a, and a part of region of the second lead frame 4. The lead frames 2, 4 have covered regions 10 which are covered with the light-transmitting resin 8, and exposed regions 11 exposed out of the light-transmitting resin 8. The light-emitting device 20 has a gap 14 between the lead frame 2 and the light-transmitting resin 8 at an inner side surface 12b of the recessed portion 12, the gap 14 having a width longer than a main wavelength of light from the light-emitting element 6 or a wavelength conversion material (when a wavelength conversion member having an emission wavelength longer than a main wavelength of light from the light-emitting element 6 is disposed around the light-emitting element 6). The first lead frame 2 and the second lead frame 4 are in close contact with the light-transmitting resin 8 at least at ends of the covered regions 10 which are located in boundaries with the exposed regions 11 or in the vicinity of the boundaries within the covered regions 10 of the first lead frame 2 and the second lead frame 4.

With this configuration, it is possible to prevent the first lead frame 2 and the light-transmitting resin 8 in a state of being in contact with each other at the end of manufacturing of the light-emitting device 20 from partially peeling due to heat generation or light in mounting the light-emitting device 20 on a substrate or lighting the light-emitting device 20, not to cause variations in light distribution due to deterioration over time. It is also possible to prevent water or flux from entering inside from the gap 14 between the first lead frame 2 and the light-transmitting resin 8 and the gap 14 between the second lead frame 4 and the light-transmitting resin 8, and prevent the light-emitting element 6 or the first lead frame 2 and the second lead frame 4 from being corroded without an additional sealing member. Therefore, variations due to changes in light distribution of the light-emitting device 20 are adequately suppressed, and a light-emitting device 20 capable of retaining high reliability for a long time can be provided.

The light-transmitting resin 8 may contain, as an essential component, an epoxy resin, and as other main components, any material including silicone resins and the like, which has a high light-transmitting property and excellent heat resistance. Further specific examples of the epoxy resin that can be used include a bisphenol A type epoxy resin, a bisphenol F type epoxy resin, a bisphenol S type epoxy resin, a hydrogenated bisphenol A type epoxy resin, a biphenyl type epoxy resin, a naphthalene type epoxy resin, an aliphatic epoxy resin, an alicyclic epoxy resin, and triglycidyl isocyanurate.

Moreover, the light-transmitting resin 8 may contain a curing agent, a curing accelerator, an additive and the like in addition to the above main components. The curing agent, the curing accelerator, the additive and the like will be described in detail below.

As the curing agent contained in the light-transmitting resin 8, at least one of phthalic anhydride, maleic anhydride, trimellitic anhydride, pyromellitic anhydride, hexahydrophthalic anhydride, tetrahydrophthalic anhydride, methylnadic anhydride, nadic anhydride, glutaric anhydride, methylhexahydrophthalic anhydride, methyltetrahydrophthalic anhydride, an amine-based curing agent, a phenol-based curing agent, hexahydrophthalic acid, and carboxylic acids, can be used.

As the curing accelerator contained in the light-transmitting resin 8, at least one of a phosphorus-based halide and metal soap can be used. Further, as the curing accelerator, metal soap and a quaternary phosphonium salt can also be used. The metal soap may contain at least one of metal salts of C4 or higher fatty acids, the metal salt being a salt of metal other than Na and K. Moreover, as the curing accelerator, at least one of tertiary phosphines, tertiary amines, imidazoles and quaternary ammonium salts can also be used.

By using such a curing accelerator, it is possible to form, with reliability, a gap 14 between the lead frame 2 and the light-transmitting resin 8, the gap 14 having a width longer than a main wavelength of light from the light-emitting element 6 or the wavelength conversion member.

As the additive contained in the light-transmitting resin 8, at least one of a polyol, a surfactant, a coloring agent, and a diffusing agent can be used A polyol is suitably contained, as a co-catalyst, in the light-transmitting resin 8 containing an epoxy resin. The polyol serving as a co-catalyst not only imparts flexibility to the light-transmitting resin 8 to improve peel adhesive strength, but also functions as a compatibilizing agent of the above-mentioned curing accelerator. Since the polyol is required to have light resistance, polyols are suitably used which are composed of any of a linear type, a branched type, an alicyclic type and an ether group-containing type which respectively have 2 to 12 carbon atoms, are non-aromatic and do not have a carbon double bond as a chemical structure. Specific examples of the polyol include propanol, isopropanol, methylcyclohexanol, ethylene glycol, glycerin, trimethylolpropane, ethylene glycol monomethyl ether and the like.

The surfactant is a substance which uniformly distributes inorganic fine particles (diffusing agent, etc.) at substantially regular intervals in the light-transmitting resin 8. The surfactant can prevent agglomeration of inorganic fine particles dispersed in a liquid light-transmitting resin in manufacturing a light-emitting device 20 to stabilize the dispersion of inorganic fine particles. With respect to selection of the surfactant, the surfactant is appropriately selected according to a kind of the inorganic fine particles to be dispersed.

When the coloring agent is contained in the light-transmitting resin 8, it is possible to allow the light-emitting device 20 to have a filter effect of cutting light from the light-emitting element 6 and/or the wavelength conversion member into light having a desired wavelength.

When the diffusing agent is contained in the light-transmitting resin 8, a light diffusion effect, a thickening property, a stress diffusion effect and the like can be achieved. Specific examples of the diffusing agent that can be suitably used include barium titanate, titanium oxide, aluminum oxide, silicon oxide and the like. This provides a light-emitting device 20 having good light distribution characteristics.

As the adhesion-imparting agent applied to the first lead frame 2 and the second lead frame 4, at least one can be used among alkyl thiols, alkoxysilane alkyl thiols, mercaptobenzothiazoles, mercaptobenzothiazole monosodium salts, triazine thiols, triazine dithiols, triazine trithiols, triazine thiol monosodium salts, triazine dithiol monosodium salts, triazine dithiol disodium salts, triazine trithiol monosodium salts, triazine trithiol disodium salts, triazine trithiol trisodium salts, and isonitrile compounds.

When such an adhesion-imparting agent is used, the first lead frame 2 and the second lead frame 4 can be brought into close contact with the light-transmitting resin 8 with reliability even though the curing accelerator is contained in the light-transmitting resin 8.

(Description of Light-Emitting Device According to Second Embodiment)

In the present embodiment, a means other than the above means of providing an adhesion-imparting agent for a lead frame can bring the light-transmitting resin 8 into close contact with the lead frame excluding the recessed portion 12 in the covered region 10.

Figures 4A, 4B, 4C:
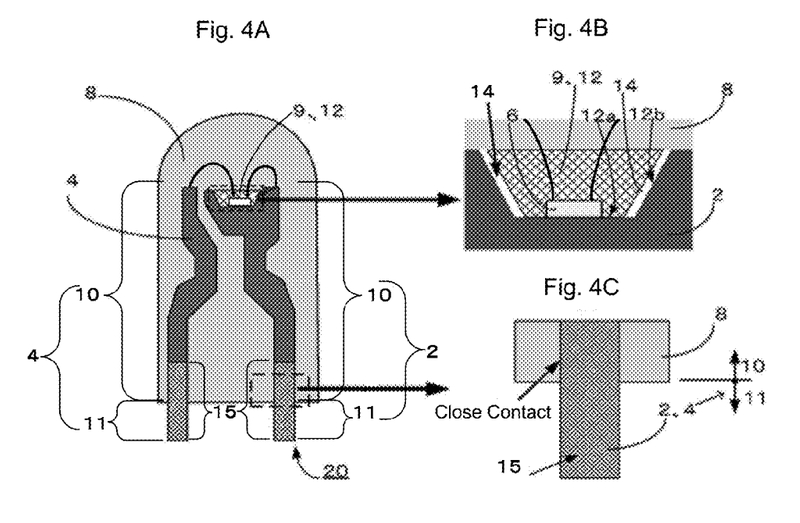
FIG. 4A is a schematic sectional view showing a light-emitting device according to a second embodiment.
FIG. 4B is a schematic sectional view showing part of a recessed portion of a lead frame.
FIG. 4C is a schematic sectional view showing part of a lower portion of the lead frame.

A light-emitting device 20 according to the second embodiment is shown in FIG. 4A to FIG. 4C. FIG. 4A is a schematic sectional view showing a light-emitting device 20 according to the second embodiment. FIG. 4B is a schematic sectional view showing part of a recessed portion 12 of the lead frame. FIG. 4C is a schematic sectional view showing part of a lower portion of the lead frame. FIG. 4B is an enlarged view of a region of a recessed portion 12 of a first lead frame 10 in FIG. 4A. In contrast to First Embodiment shown as FIG. 1, the light-transmitting resin 8 is composed of two parts, a pre-coat 9 and the remaining light-transmitting resin 8 as shown in FIGS. 4A and 4B.

For example, a pre-coat 9 of a light-transmitting resin for covering the light-emitting element 6 is filled into only the recessed portion 12 of the first lead frame 2 in which the light-emitting element 6 is housed, before covering the first lead frame 2 and the second lead frame 4 with the light-transmitting resin 8 (pre-coating step). The curing accelerator is not added to the light-transmitting resin 8 filled after the pre-coating step, but added to only the light-transmitting resin for the pre-coat 9. With this, a gap 14, which has a width longer than a main wavelength of light from the light-emitting element 6 or the wavelength conversion member, is formed between the first lead frame 2 and the pre-coat 9. On the other hand, the light-transmitting resin 8 can be brought into close contact with the first lead frame 2 and the light-transmitting resin 8 can be brought into close contact with the pre-coat 9.

In FIG. 4B, a shaded portion is the pre-coat 9 composed of a light-transmitting resin including an added curing accelerator. In the above-mentioned pre-coating step, the inner side surface 12b of the recessed portion 12 of the first lead frame 2 is previously spaced apart from the pre-coat 9 with a distance longer than a main wavelength of light output from the light-emitting element 6 at the end of manufacturing of the light-emitting device 20. Thus, the light emitting device of the second embodiment can achieve the same effect as in the light-emitting device 20 shown in FIG. 1A to FIG. 1C. Other parts of the light-emitting device 20 of the second embodiment are similar to those of the light-emitting device 20 shown in FIG. 1A to FIG. 1C, and therefore the descriptions will be omitted.

(Description of Light-Emitting Device according to Third Embodiment)

Figure 5A:
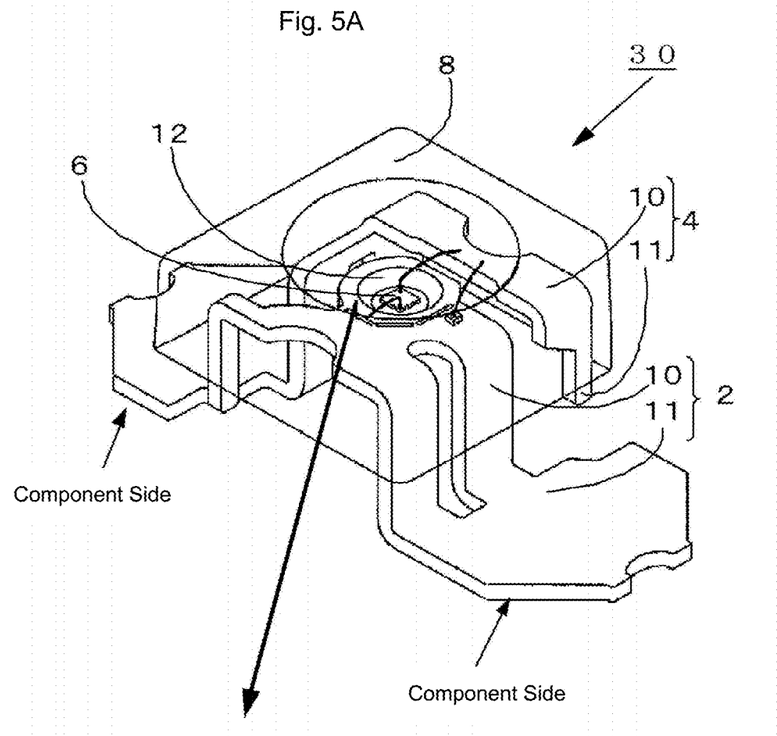
FIG. 5A is a schematic perspective view showing a light-emitting device according to a third embodiment.
Figure 5B:
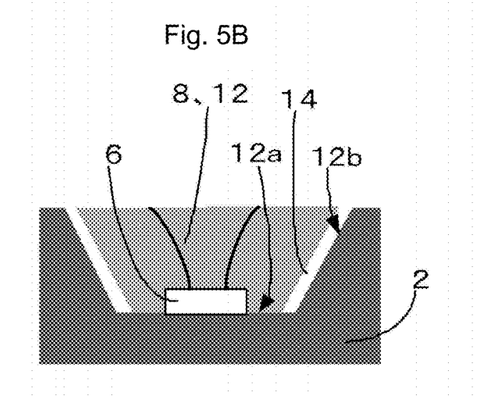
FIG. 5B is a schematic sectional view showing part of a recessed portion of a lead frame.

As a light-emitting device 30 according to a third embodiment, a surface mount light-emitting device 30 is shown in FIG. 5A and FIG. 5B. FIG. 5A is a schematic perspective view showing a light-emitting device 30 according to the third embodiment. FIG. 5A shows a perspective view of the whole light-emitting device 30. FIG. 5B is a schematic sectional view showing part of a recessed portion 12 of the lead frame. FIG. 5B shows a schematic view of a region of the recessed portion 12 of the light-emitting device 30 shown in FIG. 5A. In FIG. 5A, an interior of a region covered with the light-transmitting resin 8 is shown so as to be seen.

Also in the present embodiment, the light-emitting device 30 includes a first lead frame 2, a second lead frame 4, a light-emitting element 6 placed on a bottom 12a of a recessed portion 12 formed at the first lead frame 2, and a light-transmitting resin 8 covering a part of region of the first lead frame 2 and a part of region of the second lead frame 4. Each of the first lead frame 2 and the second lead frame 4 has a covered region 10 covered with the light-transmitting resin 8, and an exposed region 11 exposed out of the light-transmitting resin 8. In the bullet-shaped light-emitting device 20 shown in FIG. 1A to FIG. 1C, in the exposed region 11, the first lead frame 2 and the second lead frame 4 are straight in the direction perpendicular to the bottom 12a of the recessed portion 12. On the other hand, in the surface-mount light-emitting device 30 shown in FIG. 5, the first lead frame 2 and the second lead frame 4 are bent in the exposed region 11 to have a component side. That is, in the present embodiment, in the exposed region 11 exposed out of the light-transmitting resin 8, since the first lead frame 2 and the second lead frame 4 are bent, the component side is formed. The present invention is not limited this structure, and any light-emitting device 30 can be surface-mounted on a mounting board (circuit board) as long as the light-emitting device 30 has a structure having a component side. Further, a surface mount LED can be mounted by a chip mounter and reflow soldering, can be downsized and can be mounted at a relatively high density with high reliability.

As shown in FIG. 5B, also in the present embodiment, the light-emitting device 30 has a gap 14 between the first lead frame 2 and the light-transmitting resin 8 at an inner side surface 12b of the recessed portion 12, the gap 14 having a width longer than a main wavelength of light from the light-emitting element 6 or the wavelength conversion member, and the first lead frame 2 and the second lead frame 4 are in close contact with the light-transmitting resin 8 at the ends of the covered regions 10, which are located in a boundaries with the exposed regions 11 or in the vicinity of the boundaries within the covered regions 10 of the first lead frame 2 and the second lead frame 4.

In addition, in the present embodiment, the both ends of the first lead frame 2 and the both ends of the second lead frame 4 are exposed out of the light-transmitting resin 8. That is, the adhesion-imparting agent is provided for at least two regions, per one lead frame, close to a point where the lead frame is exposed out of the light-transmitting resin 8. Also in the present embodiment, the first lead frame 2 and the second lead frame 4 may be in close contact with the light-transmitting resin 8 only at the ends of the covered regions 10, or alternatively, the first lead frame 2 excluding the recessed portion 12 and the second lead frame 4 may be in close contact with the light-transmitting resin 8 in the covered regions 10 of the first lead frame 2 and the second lead frame 4.

As described above, any adhesion-imparting agent can be used for the adhesion-imparting agent according to the present embodiment, and among others, a water-soluble adhesion-imparting agent is preferred. With this, the adhesion-imparting agent can be selectively provided with ease for the first lead frame 2 excluding the recessed portion 12 and the second lead frame 4.

(Description of Method for Manufacturing Light-Emitting Device of Present Embodiment)

An example of a method for manufacturing light-emitting devices 20 and 30 of the present embodiment will be described below. The present manufacturing method includes: (1) a step of preparing a first lead frame 2 having a recessed portion 12 in which a light-emitting element 6 is placed and provided with an adhesion-imparting agent at least on part of the lead frame other than the inner side surface of the recessed portion 12 and a second lead frame 4, and (2) a step of bringing surfaces of the first lead frame 2 and the second lead frame 4 respectively provided with the adhesion-imparting agent into close contact with the light-transmitting resin 8 by covering a part of the first lead frame 2, a part of the second lead frame 4, and the light-emitting element 6 with a light-transmitting resin 8 containing a curing accelerator, and forming a gap 14 between the inner side surface 12*b* of the recessed portion 12 and the light-transmitting resin 8, the gap 14 having a width longer than a main wavelength of light from the light-emitting element 6.

The step of preparing the first lead frame 2 and the second lead frame 4 of the above (1) is described in detail. The step of preparing the first lead frame 2 and the second lead frame 4 of the above (1) includes a step of manufacturing a base frame in which shapes of the first lead frame 2 and the second lead frame 4 are formed, a step of plating the base frame with silver, and then a step of providing a predetermined region with an adhesion-imparting agent.

Herein, when the adhesion-imparting agent is provided for at least part of the first lead frame 2 other than the inner side surface of the recessed portion 12, and a part of the second lead frame 4, the adhesion-imparting agent is preferably provided such that, in a subsequent step, the first lead frame 2 and the second lead frame 4 are provided with the adhesion-imparting agent at ends of the covered regions 10. With this, it is possible to reliably prevent water or flux from entering inside from the gap 14 between the first lead frame 2 and the light-transmitting resin 8 and the gap 14 between the second lead frame 4 and the light-transmitting resin 8.

In this case, in the step of preparing the first lead frame 2 and the second lead frame 4, the adhesion-imparting agent may be provided for only at the ends of the covered regions 10, or may be provided for the first lead frame 2 excluding the recessed portion 12 and the second lead frame 4 in the covered region 10. In the latter, the first lead frame 2 excluding the recessed portion 12 and the second lead frame 4 are in a state of being in close contact with the light-transmitting resin 8 in the covered regions 10 as a post-production.

The step of the above (2) is described in detail. The light-emitting element 6 is fixed to the bottom 12*a* of the recessed portion 12 of the lead frame 2 by die bonding using an adhesive before covering the first lead frame 2 and the second lead frame 4 with the light-transmitting resin 8. With this, when covering the first lead frame 2 and the second lead frame 4 with the light-transmitting resin 8, the bottom 12*a* is bonded to the light-transmitting resin 8 even in a case that the adhesion-imparting agent is not provided for the bottom 12*a* of the recessed portion 12. Then, the step of installing the necessary wiring is performed by wire bonding.

In the present manufacturing method, by using the light-transmitting resin 8 containing the curing accelerator, it is possible to form, with reliability, a gap 14 between the inner side surface 12*b* of the recessed portion 12 and the light-transmitting resin 8, the gap 14 having a width longer than a main wavelength of light from the light-emitting element 6. In addition, the gap 14 between the first lead frame 2 and the light-transmitting resin 8 is preferably formed on an entire circumference of the inner side surface 12*b* of the recessed portion 12. Further, when a wavelength conversion material, which has an emission wavelength longer than a main wavelength of light of the light-emitting element 6 (converts light output from the light-emitting element 6 to light having a longer wavelength), is contained in the light-transmitting resin 8, it is preferred to form a gap 14 between the inner side surface 12*b* of the recessed portion 12 and the light-transmitting resin 8, the gap 14 having a width longer than a main wavelength of light from the wavelength conversion material.

A more detailed method for manufacturing light-emitting devices 20 and 30 of the present embodiment includes:

(1) First Step a first step of preparing a first lead frame 2 and a second lead frame 4, the first step including (1-1) a step of manufacturing a base frame in which shapes of the first lead frame 2 and the second lead frame 4 are formed, (1-2) a step of plating the base frame with silver, and (1-3) then, a step of providing an adhesion-imparting agent in a region close to a point where at least the first lead frame 2 and the second lead frame 4 are exposed out of the light-transmitting resin 8, and (2) Second Step a second step including (2-1) a step of fixing the light-emitting element 6 to the bottom 12*a* of the recessed portion 12 of the first lead frame 2 by use of an adhesive and wiring wires that are necessary, (2-2) a step of bringing surfaces of the first lead frame 2 and the second lead frame 4 each provided with the adhesion-imparting agent into close contact with the light-transmitting resin 8 by covering a part of the first lead frame 2, a part of the second lead frame 4, and the light-emitting element 6 with the light-transmitting resin 8 containing a curing accelerator, and forming a gap 14 between the inner side surface 12*b* of the recessed portion 12 of the first lead frame 2 and the light-transmitting resin 8, the gap 14 having a width longer than a main wavelength of light from the light-emitting element 6 or a wavelength conversion material, and (2-3) then, a step of cutting the lead frames 2 and 4 out of the base frame.

In the manufacturing method as described above, the above-mentioned optional light-transmitting resin 8, curing agent, curing accelerator, additive or adhesion-imparting agent may be used.

Thus, it is possible to manufacture the light-emitting devices 20, 30 which can prevent the inner side surface 12*b* of the recessed portion 12 of the first lead frame 2 and the light-transmitting resin 8 in a state of being in contact with each other at the end of manufacturing of the light-emitting device 20, 30 from partially peeling due to heat generation or light in mounting the light-emitting device 20, 30 on a substrate or lighting the light-emitting device 20, 30, not to cause variations in light distribution due to deterioration over time, and which can prevent water or flux from entering inside from the gap 14 between the first lead frame 2 and the light-transmitting resin 8 and the gap 14 between the second lead frame 4 and the light-transmitting resin 8, and prevent the light-emitting element 6 or the first lead frame 2 and the second lead frame 4 from being corroded without an additional a sealing member.

The light-emitting device 20, 30 and the method for manufacturing the light-emitting device 20, 30 according to the present invention are not limited to the above-mentioned embodiments, and other variety of embodiments are embraced by the present invention.

According to the present embodiment, it is possible to prevent the lead frame and the light-transmitting resin 8 from partially peeling due to heat generation or light, not to cause variations in light distribution due to deterioration over time. Further, it is possible to prevent water or flux from entering inside from the gap 14 between the lead frame and the light-transmitting resin 8 without an additional sealing member. Thereby, a light-emitting device 20, 30 capable of retaining high reliability for a long time and a method for manufacturing the light-emitting device 20, 30 can be provided.

What is claimed is:

1. A bullet-type light-emitting device comprising:
   a first lead frame having a recessed portion and a lower terminal portion;
   a second lead frame having a lower terminal portion, the second lead frame being located apart from the recessed portion of the first lead frame;
   a light-emitting element disposed on a bottom of the recessed portion of the first lead frame; and
   a light-transmitting resin covering the light-emitting element a portion of the first lead frame, and a portion of the second lead frame,
   wherein a gap is located between the first lead frame and the light-transmitting resin at an inner side surface of the recessed portion, the gap having a width that is longer than a main wavelength of light from the light-emitting element,
   wherein the light-transmitting resin includes:
      a first portion disposed in the recess and covering the light-emitting element, the first portion defining an inner side of the gap, and
      a second portion disposed (i) above the first portion, (ii) on an uppermost surface of the first lead frame surrounding the recessed portion, (iii) on an outer surface of the first lead frame except at the lower terminal portion of the first lead frame, the second portion defining an upper side of the gap, and (iv) on an outer surface of the second lead frame except at the lower terminal portion of the second lead frame,
      wherein the first portion and the second portion are formed as a unitary member comprising an epoxy resin that extends continuously from the first portion in the recess to the second portion outside the recess, and
      wherein at least the first portion of the light-transmitting resin includes a curing accelerator,
   wherein at least portions of the first and second lead frames that are adjacent to the respective lower terminal portions and covered by the second portion of the light-transmitting resin are coated with an adhesion imparting agent, and
   wherein an entirety of the gap is enclosed by the light-transmitting resin and the first lead frame.

2. The bullet-type light-emitting device according to claim 1, wherein the first and second lead frames are in close contact with the second portion of the light-transmitting resin at boundaries between the respective lower terminal portions the portions of the first and second lead frames that are adjacent to the respective lower terminal portions and covered by the second portion of the light-transmitting resin.

3. The bullet-type light-emitting device according to claim 1, wherein the light-emitting element is fixed to the bottom of the recessed portion by an adhesive and the first portion of the light-transmitting resin is bonded to the first lead frame with the adhesive.

4. The bullet-type light-emitting device according to claim 1, wherein the first lead frame is in close contact with the light-transmitting resin except at the inner side surface of the recessed portion of the first lead frame.

5. The bullet-type light-emitting device according to claim 1, wherein portions of the first lead frame that are covered by the light-transmitting resin are coated with the adhesion-imparting agent excluding the recessed portion of the first lead frame.

6. The bullet-type light-emitting device according to claim 1, wherein the lower terminal portions of the first and second lead frames are coated with the adhesion-imparting agent.

7. The bullet-type light-emitting device according to claim 1, wherein the adhesion-imparting agent is at least one selected material from the group consisting of alkyl thiols, alkoxysilane alkyl thiols, mercaptobenzothiazoles, mercaptobenzothiazole monosodium salts, triazine thiols, triazine dithiols, triazine trithiols, triazine thiol monosodium salts, triazine dithiol monosodium salts, triazine dithiol disodium salts, triazine trithiol monosodium salts, triazine trithiol disodium salts, triazine trithiol trisodium salts, and isonitrile compounds.

8. The bullet-type light-emitting device according to claim 1, wherein the curing accelerator is at least one material selected from the group consisting of a phosphorus-based halide and metal soap.

9. The bullet-type light-emitting device according to claim 1, wherein the curing accelerator is at least one material selected from the group consisting of metal soap and a quaternary phosphonium salt.

10. The bullet-type light-emitting device according to claim 1, wherein the curing accelerator is a metal soap that contains at least one metal salt of C4 or higher fatty acids, the metal salt being a salt of metal other than Na and K.

11. The bullet-type light-emitting device according to claim 1, wherein the curing accelerator is at least one material selected from the group consisting of tertiary phosphines, tertiary amines, imidazoles and quaternary ammonium salts.

12. The bullet-type light-emitting device according to claim 1, wherein the light-transmitting resin contains at least one additive selected from the group consisting of a polyol, a surfactant, a coloring agent and a diffusing agent.

13. The bullet-type light-emitting device according to claim 1, wherein each of the lower terminal portions extends in a direction orthogonal to the bottom of the recessed portion.

14. The bullet-type light-emitting device according to claim 1, further comprising:
   a wavelength conversion member having an emission wavelength longer than a main wavelength of light from the light-emitting element, the wavelength conversion member being located around the light-emitting element, wherein the gap has a width longer than a main wavelength of light from the wavelength conversion member at an inner side surface of the recessed portion.

15. The bullet-type light-emitting device according to claim 1, wherein the gap is formed on an entire circumference of the inner side surface of the recessed portion.

16. A method for producing a bullet-type light-emitting device comprising:

a step of providing a first lead frame having a recessed portion and a lower terminal portion, and a second lead frame having a lower terminal portion, wherein a light-emitting element is disposed on a bottom of the recessed portion of the first lead frame, and wherein the second lead frame is located apart from the recessed portion of the first lead frame;

a step of covering, with a light-transmitting resin, part the light-emitting element, a portion of the first lead frame, and a portion of the second lead frame;

wherein the light-transmitting resin includes:
 a first portion disposed in the recess and covering the light-emitting element, and
 a second portion disposed above the first portion, (ii) on an uppermost surface of the lead frame surrounding the recessed portion, (iii) on an outer surface of the first lead frame except at the lower terminal portion of the first lead frame, and (iv) on an outer surface of the second lead frame except at the lower terminal portion of the second lead frame, wherein the first portion and the second portion are formed as a unitary member comprising an epoxy resin that extends continuously from the first portion in the recess to the second portion outside the recess, and wherein at least the first portion of the light-transmitting resin further includes a curing accelerator, a step of curing the light-transmitting resin such that a gap is formed between the first lead frame and the light-transmitting resin at an inner side surface of the recessed portion, the gap having a width that is longer than a main wavelength of light from the light-emitting element, wherein the first portion of the light-transmitting resin defined an inner side of the gap, and the second portion of the light-transmitting resin defines an upper side of the gap, wherein at least portions of the first and second lead frames that are adjacent to the respective lower terminal portions and covered by the second portion of the light-transmitting resin are coated with an adhesion imparting agent, and wherein an entirety of the gap is enclosed by the light-transmitting resin and the first lead frame.

17. The method for producing a bullet-type light-emitting device according to claim 16, wherein, in the step of providing the first lead frame, portions of the first lead frame other than the recessed portion are coated with the adhesion-imparting agent.

* * * * *

UNITED STATES PATENT AND TRADEMARK OFFICE
CERTIFICATE OF CORRECTION

PATENT NO.         : 10,109,766 B2
APPLICATION NO.    : 14/620309
DATED              : October 23, 2018
INVENTOR(S)        : Okada et al.

Page 1 of 1

It is certified that error appears in the above-identified patent and that said Letters Patent is hereby corrected as shown below:

In the Claims

Column 17, Line 23:
Please delete "a second portion disposed above the first portion" and insert -- a second portion disposed (i) above the first portion --.

Signed and Sealed this
Nineteenth Day of February, 2019

Andrei Iancu
*Director of the United States Patent and Trademark Office*